(12) United States Patent
Yu

(10) Patent No.: US 6,495,860 B1
(45) Date of Patent: Dec. 17, 2002

(54) LIGHT EMITTING DIODE AND MANUFACTURING PROCESS THEREOF WITH BLANK

(76) Inventor: Mu-Chin Yu, 3F, No. 117, Yan-Shou Road, Tu Cheng, Taipei Hsien (TW)

( * ) Notice: Subject to any disclaimer, the term of this patent is extended or adjusted under 35 U.S.C. 154(b) by 0 days.

(21) Appl. No.: 09/583,236

(22) Filed: May 31, 2000

(30) Foreign Application Priority Data

May 4, 2000 (TW) ........................................ 089108515

(51) Int. Cl.⁷ ............................................. H01L 33/00
(52) U.S. Cl. ........................ 257/99; 257/100; 257/676
(58) Field of Search ............................ 257/99, 100, 98, 257/676

(56) References Cited

U.S. PATENT DOCUMENTS 3,914,786 A * 10/1975 Grossi ........................ 357/68
5,534,719 A * 7/1996 Chang ........................ 257/98

* cited by examiner

Primary Examiner—Sara Crane
(74) Attorney, Agent, or Firm—Troxell Law Office PLLC

(57) ABSTRACT

A light emitting diode comprises a sealed part, and at least two pins extending outward from the sealing part. The sealed part further comprises a connecting pole integrated with at least one pin, a base integrated with at least another pin, a chip received in the base, and a brazed wire connecting with the chip and the connecting pole respectively. It is characterized in that the base is free from sealing at the bottom area thereof having cone tip.

2 Claims, 8 Drawing Sheets

LIGHT EMITTING DIODE AND MANUFACTURING PROCESS THEREOF WITH BLANK

BACKGROUND OF THE INVENTION

1. Field of the Invention

The present invention relates to a light emitting diode, and particularly to a light emitting diode, in which a base thereof has a bottom part free from sealing and exposing outside for heat dissipation. Furthermore, the present invention also relates to a method making the light emitting diode and the blank thereof.

2. Description of Related Art

A light emitting diode has been used as an effective light source for years. The light emitting diode provides advantages such as a longer life span, a higher lightness and a lower power consumption such that it is widely applied in a signaling light, a brake light on a car, a Christmas decorative light, and etc. In addition, the light emitting diode can provides an effect of instant flash by way of circuit design as desired. Therefore, the light emitting diode is popularly used and there is a tendency for the light emitting diode to replace the conventional tungsten lamp.

As shown in FIG. 1, a typical light emitting diode provides at least two connecting pins A as a positive pole and a negative pole respectively. A base B is disposed above one of the poles at a lateral side thereof to receive a crystal chip or a dies C and a brazed wire D connects a nodal plate E extended from the other pole to constitute a circuit. The above said pins A, base B, nodal plate E are made of conductive sheet metal, and, in practice, are produced by way of integrally punch pressing a strip of conductive sheet metal.

As shown in FIG. 2, a blank used for a prior art light emitting diode is illustrated. It can be seen that the blank has been punch pressed to form a plurality of blank sections. Each blank section has connecting pins A, the base B, and the nodal plate E, and the base B has a shape of concave inward cone. The rest unnecessary parts are cut out as removals.

As shown in FIG. 3, a bent blank is illustrated. Each connecting pin A in the respective blank section is bent into an angle of 90 degrees with respect to the base B and the nodal plate E, and then the nodal plate E and the chip C can be connected with each other via a brazed wire D.

In order to assure a protection for all parts related to the circuit, each blank section are insulated by way of sealing compound. As shown in FIG. 4, a hold fixture is provided with recessions to fit with pattern frames F. Each blank section is received in each pattern frame F and fits with the pattern frame such that the base B and the nodal plate E are disposed in the pattern frame. Then, the transparent sealing compound such as epoxy resin is poured into each pattern frame F to be flush with the upper surface of the pattern frame F. When the poured sealing compound is solidified, the sealed blank sections are taken out and apart from the pattern frames F respectively. Finally, the sealed blank sections are separate into individual light emitting diodes and each of the light emitting diodes is like the one shown in FIG. 1. As shown in FIG. 1, the base B is completely covered by the sealing compound and insulated from the outside and the parts above the base B are in a state of being sealed to insulate from the outside either.

Because the light emitting diode is started instantaneously, an instantaneous current consumption is great accordingly so as to generate a higher temperature in the light emitting diode. When the light emitting diode is kept "on" for a long period of time, the heat generated from the chip and the brazed wire is unable to be released outward and results in a phenomenon of minor flaming to affect the durability of the light emitting diode.

SUMMARY OF THE INVENTION

An object of the present invention is to provide a light emitting diode, in which the base thereof is not sealed by the sealing compound to ease the heat dissipation generated therein.

Another object of the present invention is to provide a method to make a light emitting diode, with which a bottom part of the base on the light emitting diode is free from sealing.

A further object of the present invention is to provide a blank with a plurality of blank sections used for making light emitting diodes such that a base in each blank section thereof is possible to be made free from the sealing compound.

BRIEF DESCRIPTION OF THE DRAWINGS

The present invention can be more fully understood by referring to the following description and accompanying drawing, in which.

DETAILED DESCRIPTION OF THE PREFERRED EMBODIMENTS

Figure 1:
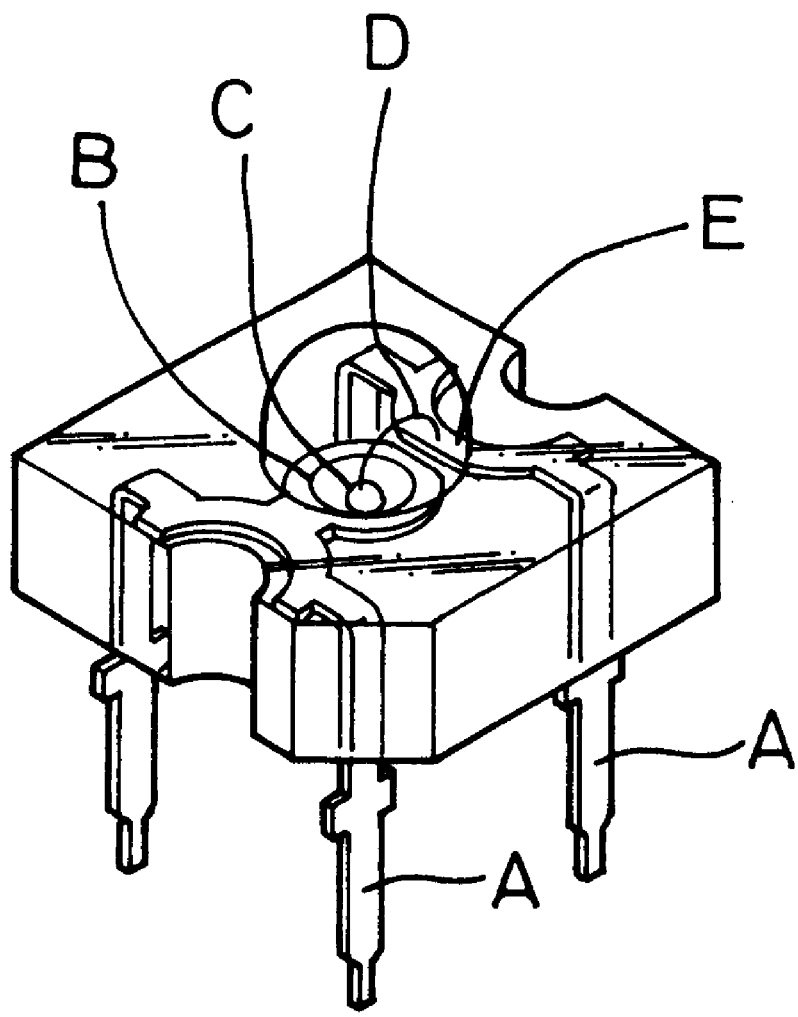
FIG. 1 is a perspective view of a conventional light emitting diode.
Figure 2:
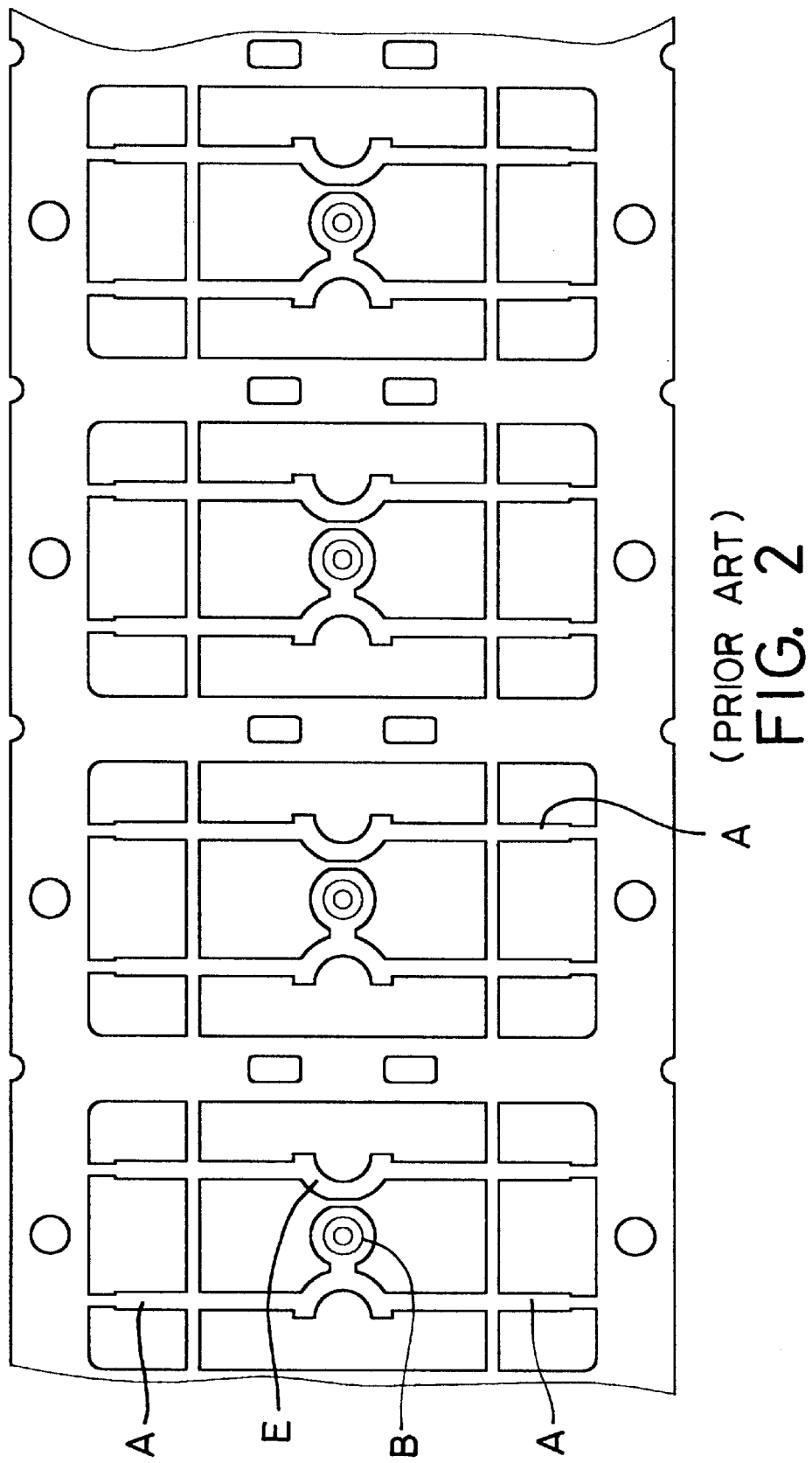
FIG. 2 is a fragmentary plan view of a blank of a conventional light emitting diode.
Figure 3:
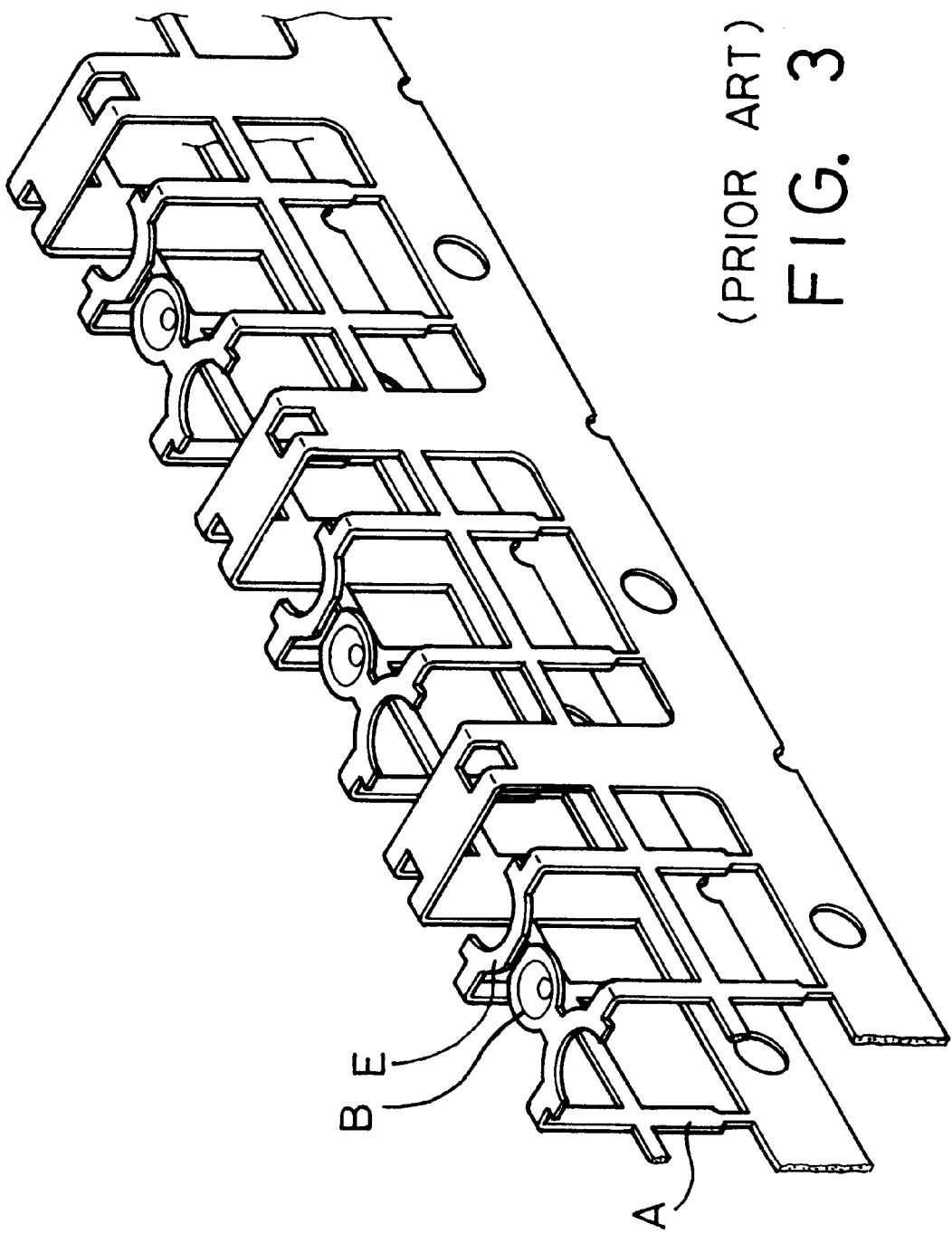
FIG. 3 is perspective view of a bent blank of a conventional light emitting diode.
Figure 4:
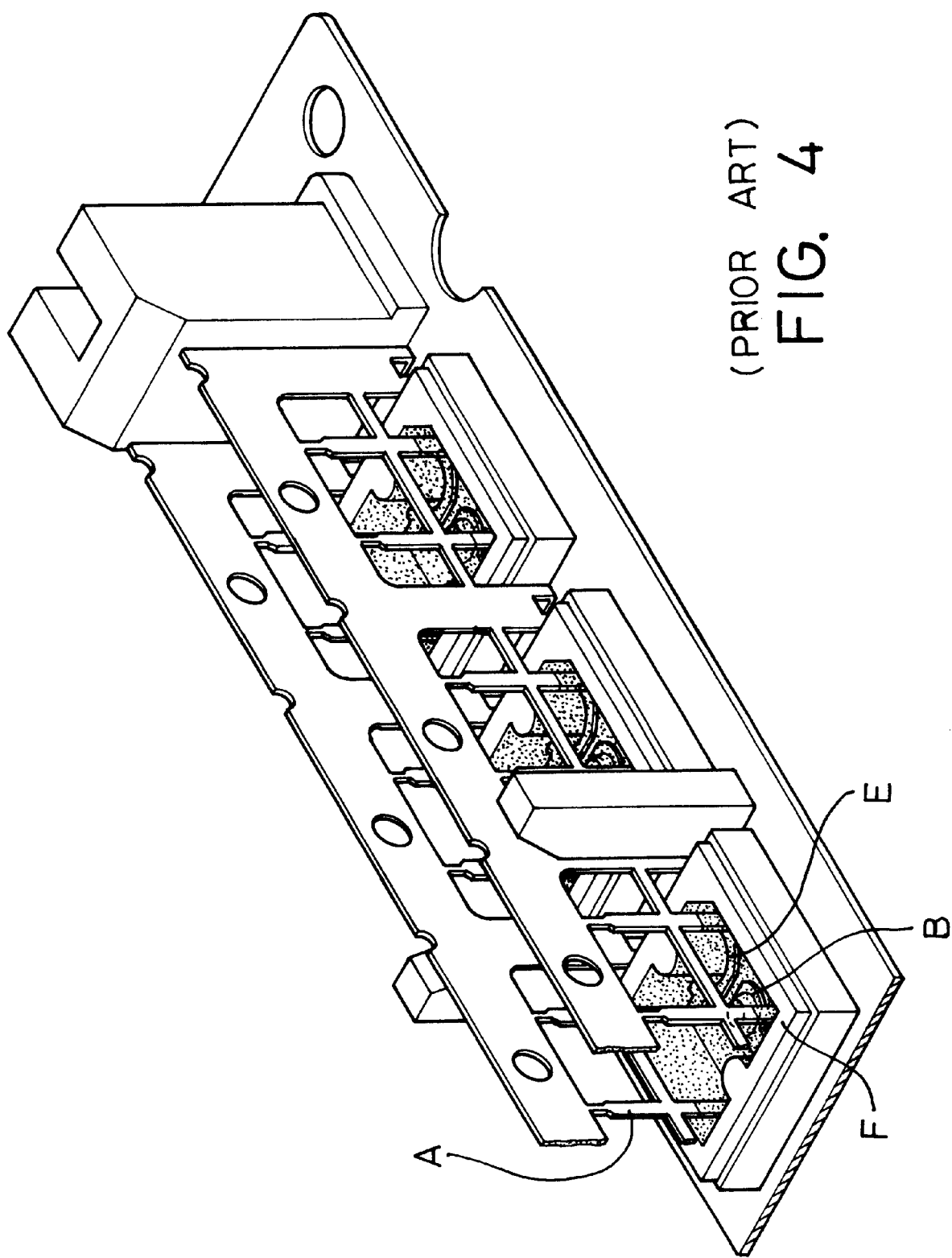
FIG. 4 is a perspective view of the bent blank shown in FIG. 3 in a process of sealing.
Figure 5:
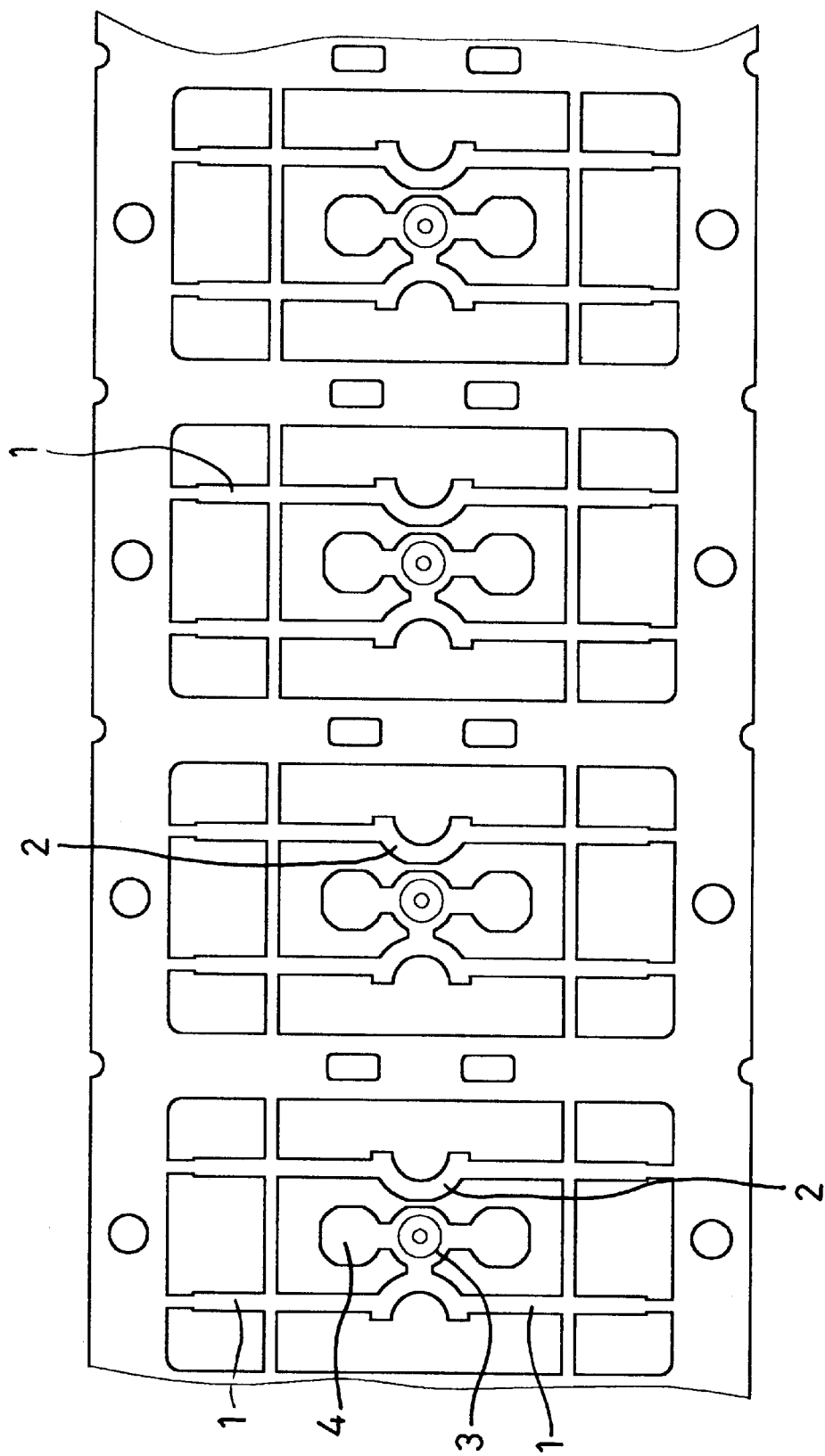
FIG. 5 is a fragmentary plan view of a blank of a light emitting diode according to the present invention.
Figure 6:
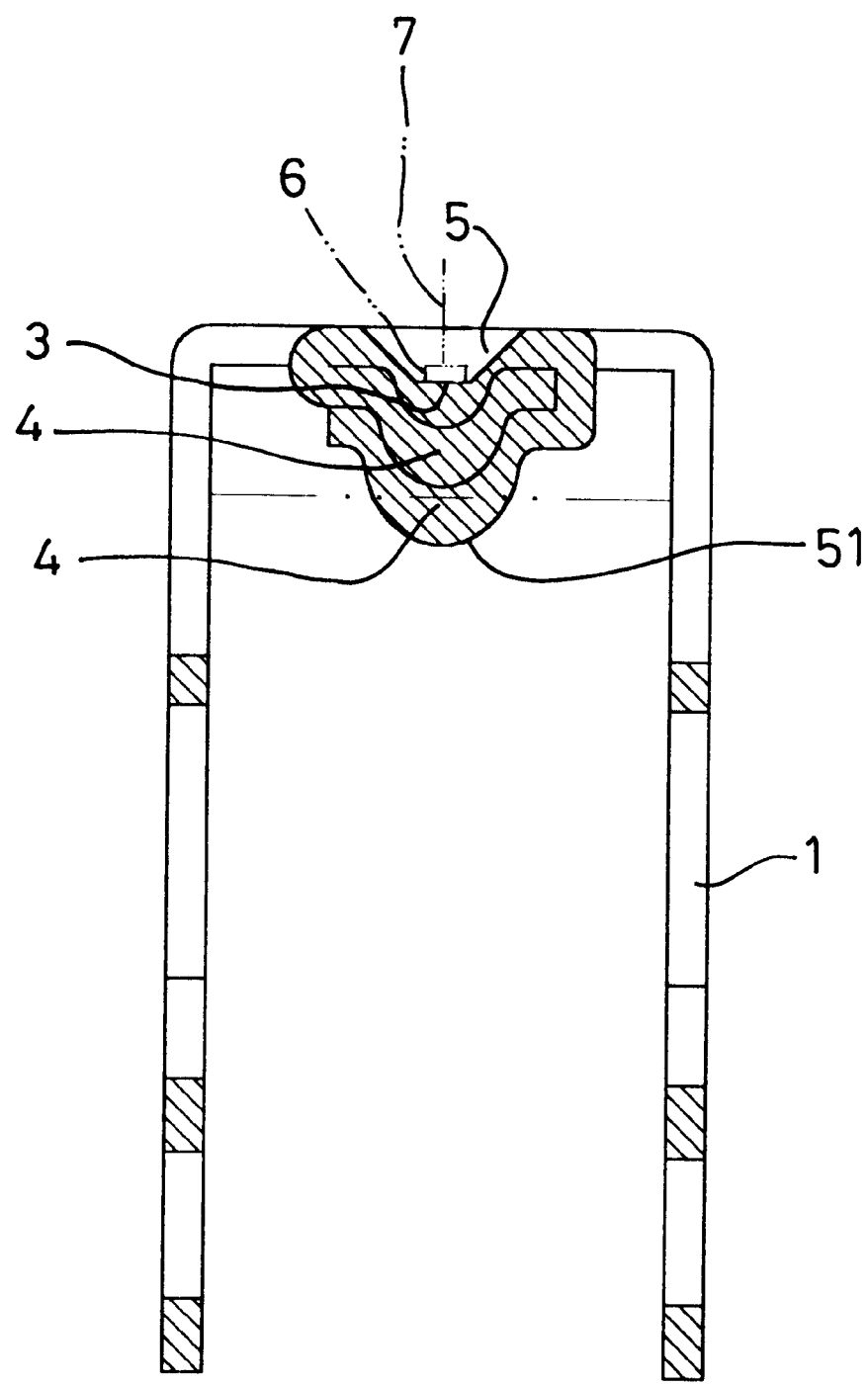
FIG. 6 is a sectional view of a reversed bent blank forming a bottom of the base therein.

Basically, the light emitting diode according to the present invention has a base free from sealing. One of the manufacturing methods comprises a step of blank forming, a step of base folding, a step of base forming, and a step of sealing.

Referring to FIGS. 5 to 8, the step of blank forming is the blank is made by way of a long strip of conductive sheet metal pressed by a die tool. The sheet metal usually has a thickness of 0.4 mm according to the frequently used specification, and it is only for taking an example not a restriction. Once the blank forming is complete, the long strip of sheet metal is formed a plurality of unit sections and each section becomes a bare material of single light emitting diode. The unit sections can be obtained by a continuous operation of punch press. Each unit section at least has two pins 1 and each pin 1 connects a pole respectively. One of the pins 1 at the middle spot projecting a connecting pole 2 toward the central location of the unit section for disposing a brazed wire. Another pin 1 close to the middle spot thereof extends a base plate 3 at central location of the unit section.

The base plate 3 at least one of both lateral sides extends outward a flip 4 and the width of the flip 4 is corresponding to the base plate 3 such that the same area of the flip 4 can be bent to form the bottom of a base 5. The embodiment illustrated in FIG. 5 has a respective flip 4 extends outward from both lateral sides and two sets of two pins 1.

The step of base folding is that at least an extended flip 4 from one side of the base plate 3 is folded to the base plate 3. The flip 4 may be folded over the base plate 3 but it is preferable that the flip 4 is folded under the base plate 3. If both lateral sides of the base plate 3 have an extended flip 4 respectively, the three parts, the two flips 4 and the base plate 3, can be folded and exerted an appropriate external force to form a structure of tightly contacting to each other.

The step of base forming is an prior art and the folded up flips 4 and base plate 3 are die pressed to form a base 5 for receiving a chip or a dies. Meanwhile, the pins are bent as the prior art does such that the step of sealing can be proceeded successively.

Figure 7:
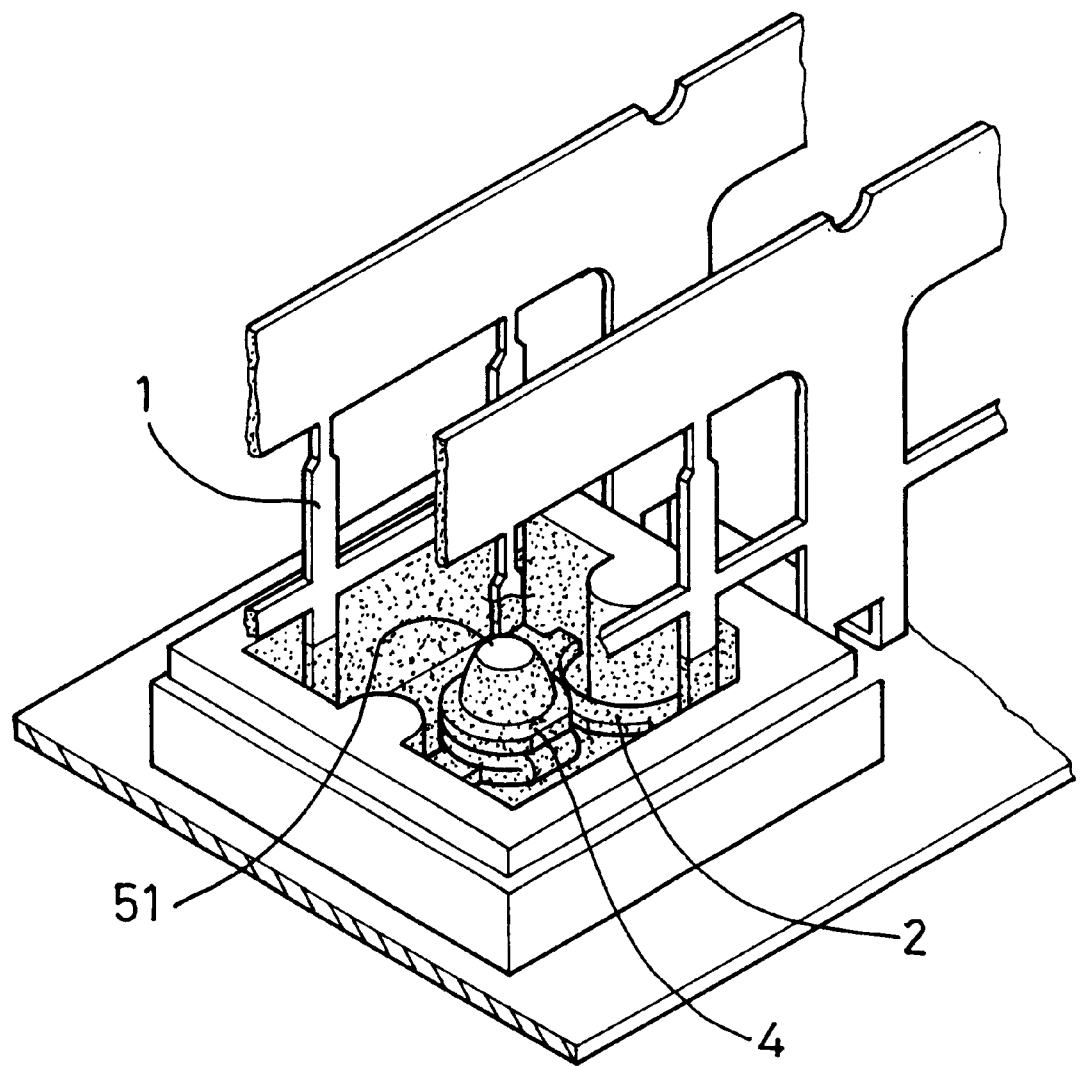
FIG. 7 is a fragmentary perspective view of the reversed bent blank of the present invention in the process of sealing.

The step of sealing is also a prior art. The chip or dies 6 is received in the base 5 made in the step of base forming and completes the brazed wire 7. Then, place the semi-product into a sealing mold in a way that the base 5 faces downward. As shown in FIG. 7, the sealing compound is poured into the sealing mold and the sealing compound can be a prior art such as transparent epoxy resin fluid. After the sealing compound has solidified, the finish product can be obtained as soon as the sealing mold is released.

Figure 8:
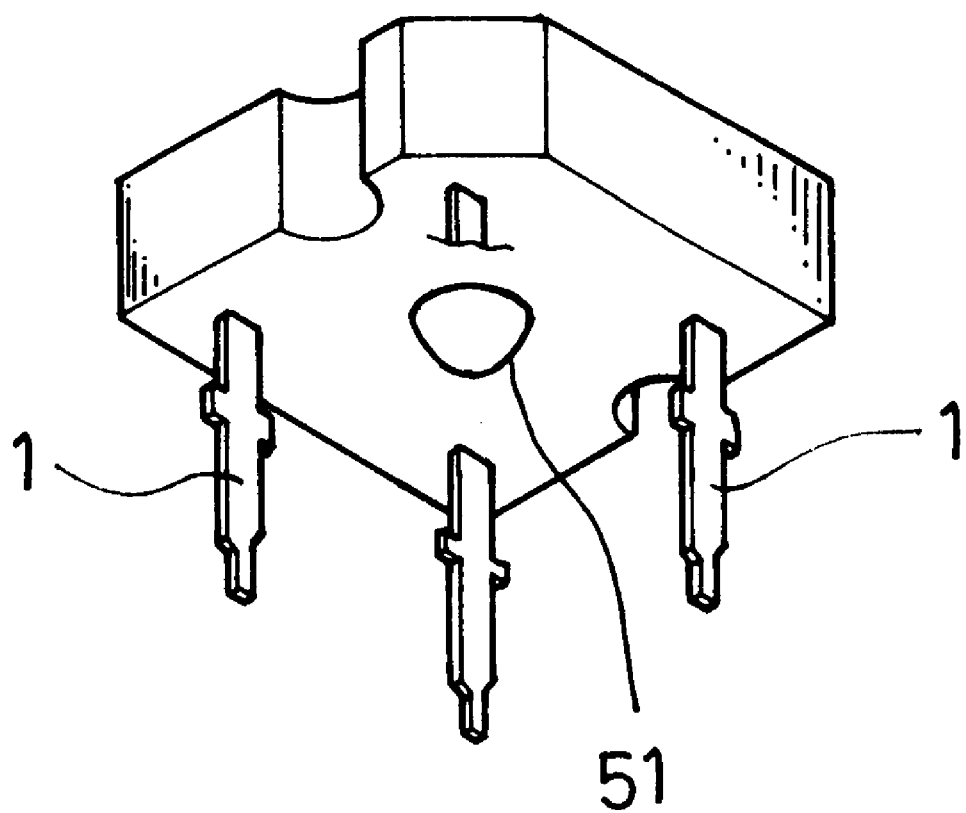
FIG. 8 is a perspective view of the light emitting diode of the present invention after sealing.

Accordingly, the thickness of the base 5 has triple thickness of the prior art base, that is, if the sheet metal has a thickness of 0.4 mm, the thickness of the base 5 will be 0.8 mm more than the thickness of the prior art base. Thus, once the step of sealing is finished, the area of cone tip 51 on the base 5 is free from being covered by the sealing compound. Hence, the area of cone tip 51 is in a state of non-enclosure such that it is possible to contact with the outside as shown in FIG. 8. As a result, the heat generated in the light emitting diode may transmit outside to dissipate the heat such that a phenomenon of overheat in the light emitting diode can be avoided naturally and the life span thereof can be lasted substantially.

In order to obtain the cone tip 51 free from sealing, the above said base 5 is provides with multiple layers of sheet metal. It is noted that the base 5 with single layer of sheet metal also can be made a free enclosed bottom by way of other ways such as lowering the height of the sealing mold, or increasing the length of the base 5. In this way, it can be understood that the light emitting diode is disposed in the cone tip 51 exposing outside and not covered by the sealing compound.

It is appreciated that the light emitting diode made according the present invention effectively promotes the function of heat dissipation so that the long-run trouble problem caused by the sealing procedure is solved advantageously so as to prevent from damage resulting from overheat. Therefore, the life span for an electronic light emitting component is extended substantially.

While the invention has been described with reference to preferred embodiments thereof, it is to be understood that modifications or variations may be easily made without departing from the spirit of this invention, which is defined by the appended claims.

What is claimed is:

1. A light emitting diode having improved heat dissipation and comprising:
   a) a connecting pole having first pins extending from two opposite sides thereof, the connecting pole and first pins forming a U-shaped configuration, the first pins having first end portions;
   b) a base plate having a cup recess formed therein and connected to two second pins, the base plate and second pins forming a U-shaped configuration, the second pins having second end portions, the base plate including at least one flip panel integrally formed at a side of the base plate and bent so as to contact a bottom of the base plate, the at least one flip panel forming a cone tip at a bottom thereof;
   c) a chip located in the cup recess;
   d) a wire connecting the chip to the connecting pole; and,
   e) a sealing compound encapsulating the chip, the base plate, the connecting plate and the wire, whereby the first end portions, the second end portions and the cone tip of the at least one flip panel extend outwardly of the sealing compound to improve heat dissipation from the light emitting diode.

2. The light emitting diode of claim 1 wherein the base plate includes first and second flip panels integrally formed on opposite sides thereof, the first flip panel bent so as to contact the bottom of the base plate and the second flip panel bent so as to contact a bottom of the first flip panel, the bottom of the second flip panel forming the cone tip.

* * * * *